US007991814B2

(12) United States Patent
Filippov et al.

(10) Patent No.: US 7,991,814 B2
(45) Date of Patent: Aug. 2, 2011

(54) ULTRA FAST CIRCUITRY FOR DIGITAL FILTERING

(75) Inventors: Timur V. Filippov, Mahopac, NY (US); Oleg A. Mukhanov, Putnam Valley, NY (US)

(73) Assignee: Hypres, Inc, Elmsford, NY (US)

( * ) Notice: Subject to any disclaimer, the term of this patent is extended or adjusted under 35 U.S.C. 154(b) by 935 days.

(21) Appl. No.: 11/895,478

(22) Filed: Aug. 24, 2007

(65) Prior Publication Data

US 2008/0231353 A1    Sep. 25, 2008

Related U.S. Application Data

(60) Provisional application No. 60/840,379, filed on Aug. 25, 2006.

(51) Int. Cl.
*G06F 17/17* (2006.01)
*G06F 7/38* (2006.01)
*G06F 7/50* (2006.01)

(52) U.S. Cl. .......................... 708/313; 708/443; 708/707
(58) Field of Classification Search .................. 708/313, 708/433, 707
See application file for complete search history.

(56) References Cited

U.S. PATENT DOCUMENTS

| | | | | |
|---|---|---|---|---|
| 3,784,854 A | * | 1/1974 | Herrell | 708/700 |
| 5,818,743 A | * | 10/1998 | Lee et al. | 708/628 |
| 6,581,082 B1 | * | 6/2003 | Opsahl | 708/443 |
| 7,392,277 B2 | * | 6/2008 | Fletcher | 708/708 |
| 2008/0129368 A1 | * | 6/2008 | Furuta et al. | 327/367 |

* cited by examiner

*Primary Examiner* — Chuong D Ngo
(74) *Attorney, Agent, or Firm* — Henry I. Schanzer, Esq.

(57) ABSTRACT

The invention includes a novel differentiator cell, a novel resample unit cell, and precision synchronization circuitry to ensure proper timing of the circuits and systems at the anticipated ultra-high speed of operation. The novel differentiator cell includes circuitry for combining a carry input signal, a data bit signal and the output signal of a NOT cell and applying the signals as distinct and separate pulses to the input of a toggle flip-flop (TFF) for producing an asynchronous carry output and a clocked data output. The novel differentiator cells can be interconnected to form a multi-bit differentiator circuit using appropriate delay and synchronization circuitry to compensate for delays in producing the carry output of each cell which is applied to a succeeding cell. The novel resample cell includes a non-destructive reset-set flip-flop (RSN) designed to receive a data bit, at its set input, at a slow clock rate, which data is repeatedly read out of the RSN at a fast clock rate, until the RSN is reset. The novel differentiator and resampler cells can be interconnected, for example, to form the differentiator and up-sampling sections of a digital interpolation filter (DIF). Also, the relative clocking of bit slices (columns) in such a DIF may be achieved by using the fast clock signal to synchronize the slow clock which controls data entry. The circuits of the invention can be advantageously implemented with Josephson Junctions in rapid-single-flux-quantum (RSFQ) logic.

31 Claims, 13 Drawing Sheets

US 7,991,814 B2

ULTRA FAST CIRCUITRY FOR DIGITAL FILTERING

This invention claims priority from U.S. provisional application Ser. No. 60/840,379 titled Techniques for Processing Multi-GHz Frequency Signals filed Aug. 25, 2006.

"The invention described herein may be manufactured, used, imported, sold, and licensed by or for the Government of the United States of America without the payment of any royalty thereon."

BACKGROUND OF THE INVENTION

This invention relates to ultrafast electronic circuits for digital signal processing. There is a constant need for circuits which can operate at extremely high speed. A technology which offers ultrafast operation is the rapid-single-flux-quantum (RSFQ) logic technology which is based on the use of superconducting Josephson junctions (JJ's). This technology operated at cryogenic temperatures provides the fastest digital circuits in any electronic (non-optical) technology. For example, simple circuits formed in this technology can operate at over 700 GHz and complex clocked circuits have been demonstrated to operate in the range of 40 GHz. These circuits are based on the distribution of narrow picosecond pulses between logic gates. A problem with these circuits is that due to these high speeds, precision timing in the clock distribution is critical.

This invention also relates to the design of circuitry which may be used, for example, to form a digital interpolation filter (DIF) or a digital decimation filter (DDF). The block diagram of a DIF of interest is shown in FIG. 1. The DIF shows an m bit word applied to the m-bit cells of the k differentiator circuits 100 to provide k stages (1 through k) of differentiation of the input signal at a slow clock (SC) rate (e.g., $f/2^n$). The outputs of the kth stage are applied to a "resample unit" (RU) 200 that increases the sample rate, followed by k stages of integration circuits 300 (1 through k) at a fast clock (FC) rate (e.g., f). (The numbers of integration and differentiation stages are matched to avoid signal distortion.) The simplest zeroth-order (k=0) DIF would consist of just the resample unit, but the output would be a crude step-like function. A first-order (k=1) would have an output that interpolates linearly between the input points, while k=2 interpolates quadratically. Additional stages provide additional levels of interpolation.

Suitable differentiator and resample circuits have not previously been implemented in the RSFQ technology. Critical aspects in the design of suitable circuits is that they provide a desired function and precision timing in the distribution of the clocking signals and that they be reasonably simple to manufacture and be made up of cells which can be readily interconnected to handle multi-bit signals (words) of different size.

SUMMARY OF THE INVENTION

Circuits and systems embodying the invention include a novel differentiator cell, a novel resample unit cell, and precision synchronization circuitry to avoid clock skew at a fast clock rate (FC), to ensure proper timing of the circuits and systems.

The novel differentiator cell can be used, for example, to form the differentiator section of a digital interpolation filter (DIF). The differentiator cell includes circuitry for summing a carry input signal, a present data bit, and an inverted bit from a previous clock period (generated pursuant to producing the two's complement of an m-bit word) and applying the sum to a Toggle flip-flop (TFF) for producing an asynchronous carry out and a clocked data output. The differentiator circuitry may be comprised of superconducting Josephson junctions (JJ's) interconnected in accordance with rapid-single-flux-quantum (RSFQ) logic technology to enable ultra fast operation.

Each differentiator cell includes: (a) a first network for coupling an input carry bit to a first clocked data flip flop (DFF) and producing a carry signal output indicative of the carry input; (b) a second network for coupling an input data bit (from an m-bit word) to a second clocked data flip flop (DFF) and producing a data signal output indicative of the data input; (c) a third clocked storage and inverting network (also referred to herein as a NOT cell) for producing an inverted signal output indicative of the data bit present at the previous clock interval; (d) clocked circuitry for combining the outputs of the first, second and third networks and applying them as distinct and separate pulses to the input of a TFF; and (e) the TFF producing in response to the signals at its input a carry output (which is asynchronous) and a data output (which is clocked).

The networks of the differentiator cell are so laid out and a clock signal applied to the networks is so distributed within the cell that the sequence of the cell operation is controlled to generate (e.g., three) distinct signals and their application to the TFF. In one embodiment, the circuit is arranged such that the clock signal first triggers the first flip flop and causes its output to be applied to the TFF, then triggers the NOT cell to cause its output to be applied to the TFF, and then triggers the second flip flop to cause its output to be applied to the TFF.

According to an aspect of the invention, to process an m-bit word, m differentiator (DFR) cells, one DFR cell per bit, may be sequentially arranged to form a differentiator stage (of the same order). Each one of the m data bits is applied to the data input terminal of a corresponding DFR cell and, except for the last DFR cell of the stage, the carry output of each stage is applied to the carry input of the next stage. Furthermore, a clock signal, to control and synchronize the operation of the cells of the stage, is applied to the DFR cell corresponding to the least significant bit and then via each DFR cell to the next succeeding cell. The data outputs and the clock outputs of the DFR cells of a differentiator stage may be applied to the data inputs and clock inputs of the DFR cells of a next higher order differentiator stage or to the inputs of a resample unit.

The data outputs of the bit cells of the highest order differentiator stage are applied to corresponding bits of a resample unit (RU). The RU is driven by a slow clock (SC) and a fast clock (FC) and its output is applied to an integrator circuit. The combination of the differentiator circuit with the RU and the integrator section may be used to form a DIF which may be used in the manufacture of a direct digital synthesizer, where all components must operate at high speeds in superconducting technology (FIG. 2).

In accordance with one aspect of the invention the fast clock is used to synchronize the distribution of the slow clock serially along the DFR cells of a differentiator stage(s), with the slow clock being delayed by one fast clock period as it passes from one DFR cell to the next DFR cell. The delay ensures that the carry output from a preceding cell will be generated before the next succeeding cell is activated by the slow clock. The slow clock output of the DFR cells of a differentiator stage, as delayed, is applied (in a columnar fashion) to corresponding cells of the RU. Synchronizing the slow clock with the fast clock enables the output of the RU to be applied in a synchronous manner to the cells of the integrator which are activated and driven by the fast clock.

Another aspect of the invention includes a novel resampler cell comprised of a non-destructive reset-set flip flop (RSN) and a D-flip-flop (DFF). The RSN functions as an upsampler since the SET input to the RSN contains a data bit from the differentiator (generated at the SC rate) and a fast clock (FC) triggers the read command input (NDRead) of the RSN. The D-flip-flop (DFF) serves to synchronize the slow clock with the fast clock, and resets the RSN cell just before it receives a new data bit. The resampler circuitry, like the differentiator circuitry, may be comprised of superconducting Josephson junctions (JJ's) interconnected in accordance with rapid-single-flux-quantum (RSFQ) logic technology to enable ultra fast operation.

The differentiator stage circuitry and the resample unit circuitry were designed in a modular format using bit-slices (one circuit per bit) that can be extended to form an arbitrary order of stages (i.e., k may be any integer equal to or greater than one) and an arbitrary number of bits (i.e., m may be any integer equal to or greater than one). A specific implementation with 16 bits and 2nd order (two stages each of integration and differentiation) was designed for an input data rate of 125 MHz and an output data rate of 2 GHz (a conversion rate factor of 16). This design, using standard RSFQ cells including flip-flops (D, T, and RS), inverters, splitters, and combiners, may be compatible with operation of up to at least 20 GHz. Four-bit slices of this design were fabricated and tested, verifying the design and functionality.

BRIEF DESCRIPTION OF THE DRAWINGS

In the accompanying drawings like reference characters denote like components.

DETAILED DESCRIPTION OF THE INVENTION

The high-level architecture of a Cascaded Integrator Comb (CIC), or alternatively a sinc filter is known, and the implementation of a digital decimation filter (DDC) has been demonstrated using multi-bit integrator cells made in ultrafast RSFQ technology. The present invention demonstrates a complete RSFQ implementation of a Digital Interpolation Filter (DIF) of the type shown in FIG. 1.

There are several significant features of the present invention:

1—The design of a novel differentiator cell (DFR) which may be implemented in RSFQ technology.

2—Interconnection of the DFR cells to form a multi bit differentiator circuit.

3—The design of a novel resample unit (RU) cell which may be implemented in RSFQ technology.

4—The combination of the differentiator circuit and resample unit, and the further combination of the differentiator circuit and resample unit with integrator cells into a modular bit-slice (columnar) structure that is synchronized by a pipelined fast clock, in a way that permits easy extension to more bits and higher orders while maintaining maximum output speed.

Figure 2:
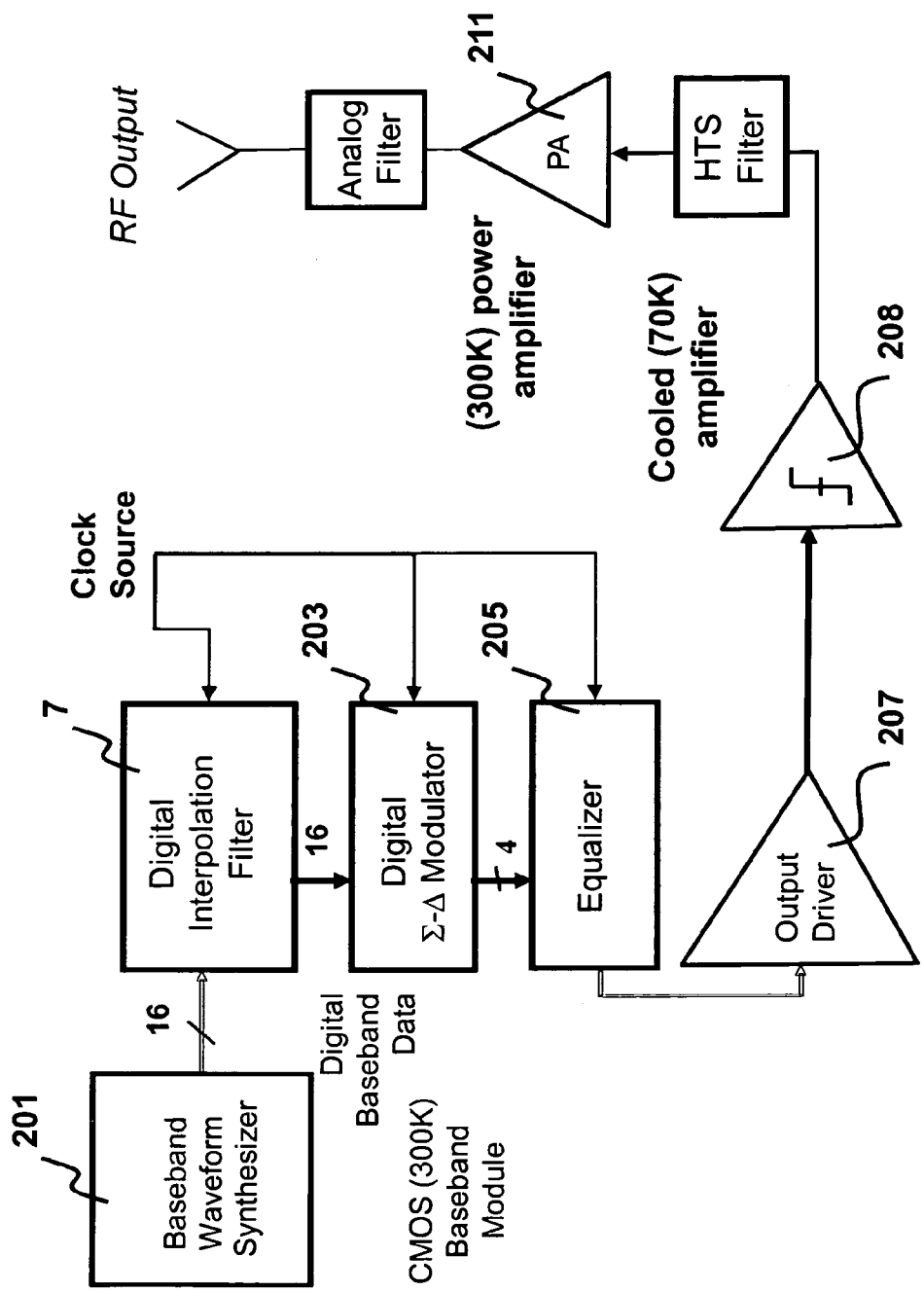
FIG. 2 is a block diagram of a Direct Digital Synthesizer (DDS) built around a superconducting Digital Interpolation Filter and other ultrafast RSFQ circuits.

FIG. 2—Brief description of a system employing circuitry embodying the invention: One exemplary application of a DIF (e.g., DIF 7), which may be formed in accordance with the invention, is shown in FIG. 2 which illustrates a broadband direct digital synthesizer (DDS) which can be used to transmit an arbitrary RF signal. This system includes both conventional semiconductor components and RSFQ superconducting components. The system includes a high-speed superconductor module enabling ultra-linear direct generation of wideband RF waveforms. A baseband modulated 16-bit digital signal produced, for example, by a commercial CMOS baseband waveform synthesizer 201 is applied to a superconducting DIF 7 which digitally oversamples and interpolates. A digital input signal at, for example, 125 MS/s (corresponding to a maximum bandwidth of 62.5 MHz) is sent to the superconducting DIF, which interpolates extra data points and may be clocked, for example, at an output frequency of 2 GHz. This results in moving signal images farther out of the band of interest. This is then passed to a superconducting digital delta-sigma modulator 203, which takes the 16-bit output of the DIF and encodes it into a 4-bit sigma-delta oversampled digital stream. This is passed to an ultrafast superconducting digital equalizer 205 that performs a predistortion in order to compensate for limited bandwidth and distortion of output lines and amplifiers. The resulting output is then passed to a fast superconducting output driver 207 (based, for example, on SQUID arrays), which provides the first step of amplification. The output data is subsequently amplified using a cooled digital semiconductor amplifier 209 and finally by a room-temperature semiconductor power amplifier (PA) 211. The amplified signal is also band-limited using high quality analog filters, both superconducting (such as high-temperature superconductors) and room-temperature.

The present invention focuses on components which may be used to form a DIF or a DDF or be used in any other application. For example, the components of a DIF and/or the DIF itself could also be used in up-conversion of a baseband signal onto a higher-frequency carrier for a bandpass digital transmitter. Furthermore, a DIF, DDF, differentiator, integrator, and sample rate converters (up-sample and down-sample) are, themselves, components in a general multi-rate digital signal processing system.

A CIC design (based on a known filter architecture ascribed to E. B. Hogenauer) has many advantages for RSFQ implementation of the DIF, for several reasons. First, it has a recursive design with a small number of repeated cells. Second, in RSFQ technology, accumulators (flip-flops with internal gate memory) and inverters are simple, standard, cells that can operate at very high frequencies. Third, this type of filter design does not require any multiplication and is suitable for high-speed use. Applicants' invention is directed to a new differentiator (DFR) cell and to a novel up-sampling cell which may be used to interface between a differentiator stage and an integrator stage.

Figure 3A:
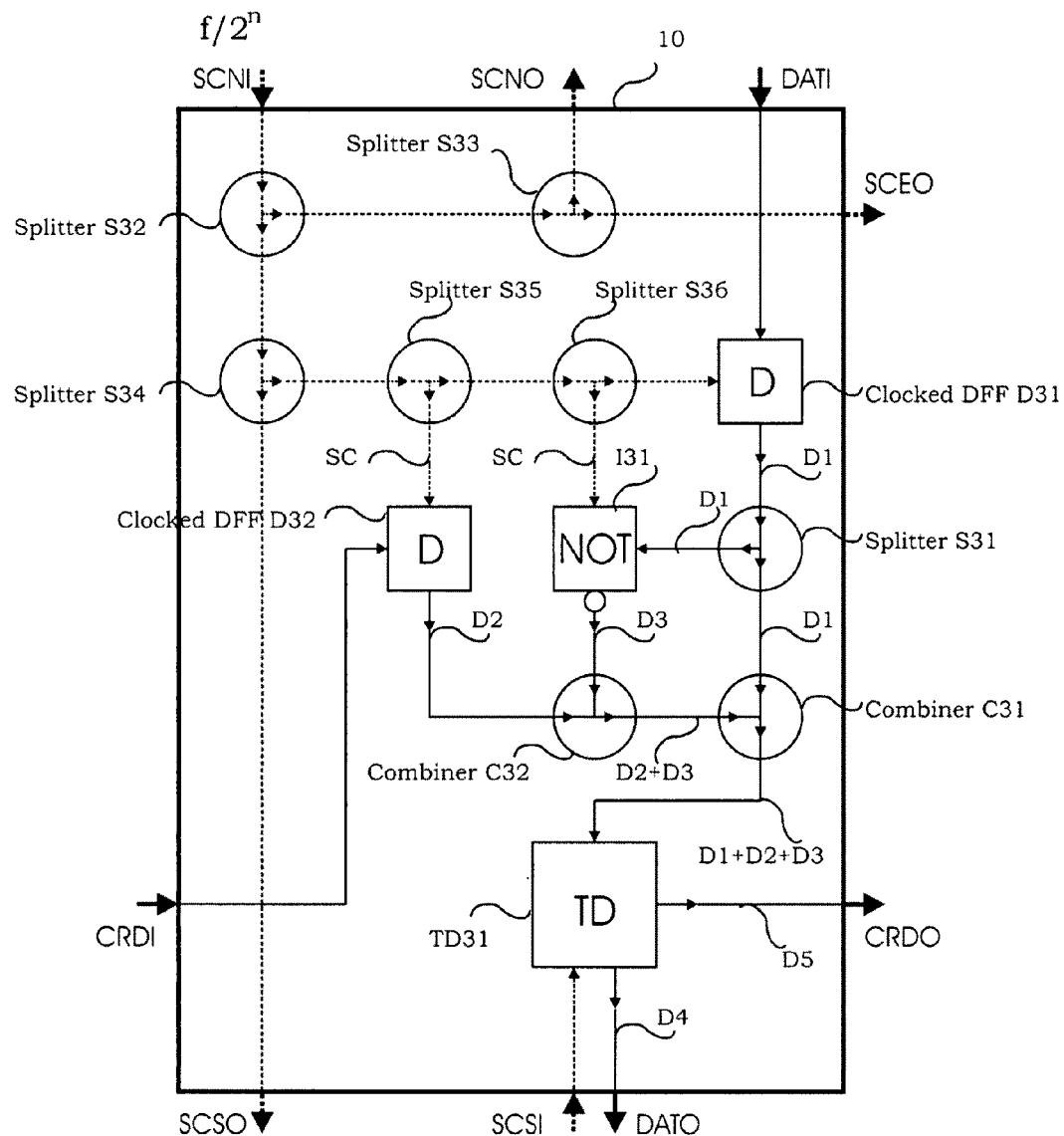
FIG. 3A is a cell-level block diagram of 1-bit Differentiator Circuit (DFR) embodying the invention which may be implemented using RSFQ cells.

The block diagram for a one-bit differentiator (DFR) cell, embodying the invention is shown in FIG. 3A. The differentiation is performed by combining and summing pulses corresponding to; (a) a carry input bit (e.g., D2) signal; (b) a data bit signal (DATI, also identified as D1, which represents one data bit of a multi-bit word being applied to the DFR cell); and (c) the inverted bit signal from a previous clock period (e.g., D3, which is generated to produce the two's complement of the multi-bit word) and applying the combination of (of D1, D2 and D3) to a Toggle-flip-flop (TFF), identified as TD31, for summing the pulses (or lack thereof) corresponding to the signals and generating an asynchronous carry output (D5) at a carry output terminal (CRDO) and a data output (D4) on a data output terminal (DATO) in response to a clocked readout command (SCSI). The differentiation function performed by the cell for an m-bit word ($z_k$) is in accordance with the following equation:

$$z_k - z_{k-1} = z_k + \text{NOT}(z_{k-1}) + 1 \quad \text{Eq. 1}$$

The series of numbers $\{z_k\}$ for k=1 to N corresponds to a time series of binary words representing the digital signal; and $z_{k-1}$ represents the word present at or during the previous clock period. So $z_k - z_{k-1}$ corresponds to the difference between a given digital signal and the previous one, which is the discrete operation of differentiation. This subtraction ($z_k - z_{k-1}$) may be carried out using two's complement binary arithmetic. Briefly, as is known in digital systems, to subtract A−B in two's complement arithmetic (where A and B are digital binary numbers), the number B is first converted to its negative by reversing each bit (NOT) and adding 1, and then adding the resulting number to A. This is what this formula (eq. 1) indicates. The +1 in eq. 1 is handled in accordance with the invention at the least significant bit (LSB) position. This is the reason for the special arrangement for the LSB in FIGS. 4A and 4B.

Thus, the circuit of FIG. 3A enables the implementation of the logic formulation of Eq. 1. Each cell 10, as shown in FIG. 3A, includes a destructive read-out Toggle flip flop also identified as TFF and as TD31 (e.g., schematically shown in FIGS. 3G and 3H), a NOT cell (e.g., schematically shown in FIG. 3D), two Data flip-flops (denoted as D or DFF), also referred to herein as clocked flip-flops, (e.g., schematically shown in FIG. 3C), a number of asynchronous splitters (S31-S36) (e.g., see FIG. 3E), and two combiner (confluence buffer) cells (C31, C32) (e.g., see FIG. 3F). The splitters are shown by a circle with two arrows pointing away from the center of the circle and the combiners are represented by a circle with two arrows pointing towards the center of the circle. The sub networks in cell 10 may be standard or specially designed elementary cells in RSFQ technology as shown in FIGS. 3C, 3D, 3F, and 3G (with a modified cell in 3H). In the schematic diagrams, JJ's are indicated by the symbol X, the application of bias currents is indicated by small arrow heads, and inductors are shown by a coil symbol.

Figure 3B:
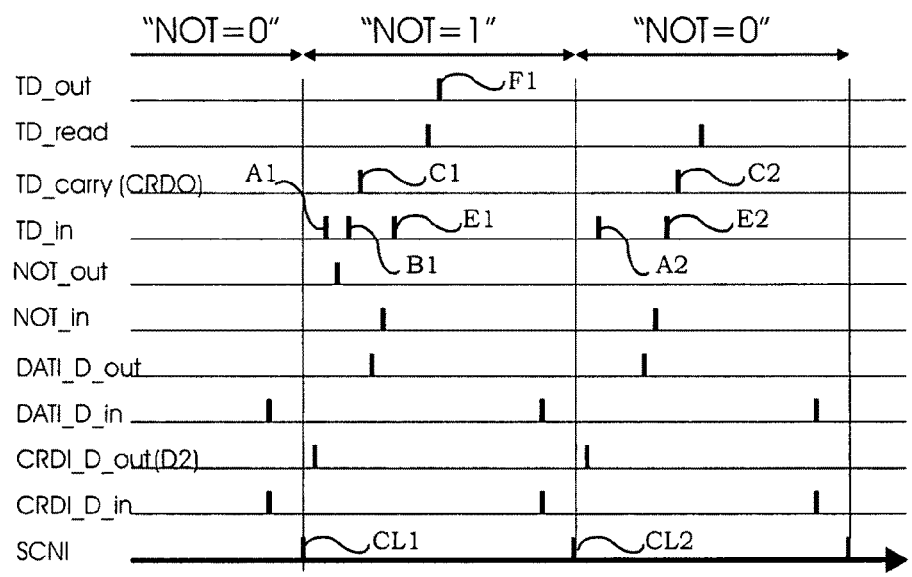
FIG. 3B is a timing diagram illustrating the operation of the cell of FIG. 3A.
Figure 3C:
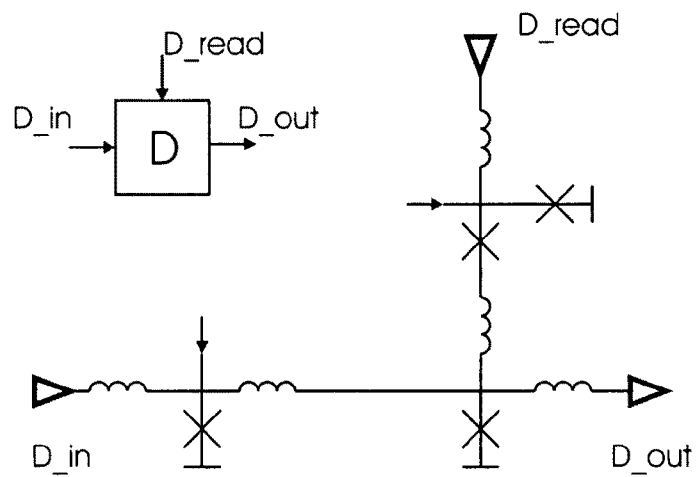
FIG. 3C is a schematic diagram of a D-flip-flop (DFF) cell which may be used in the circuit of FIG. 3A.
Figure 3D:
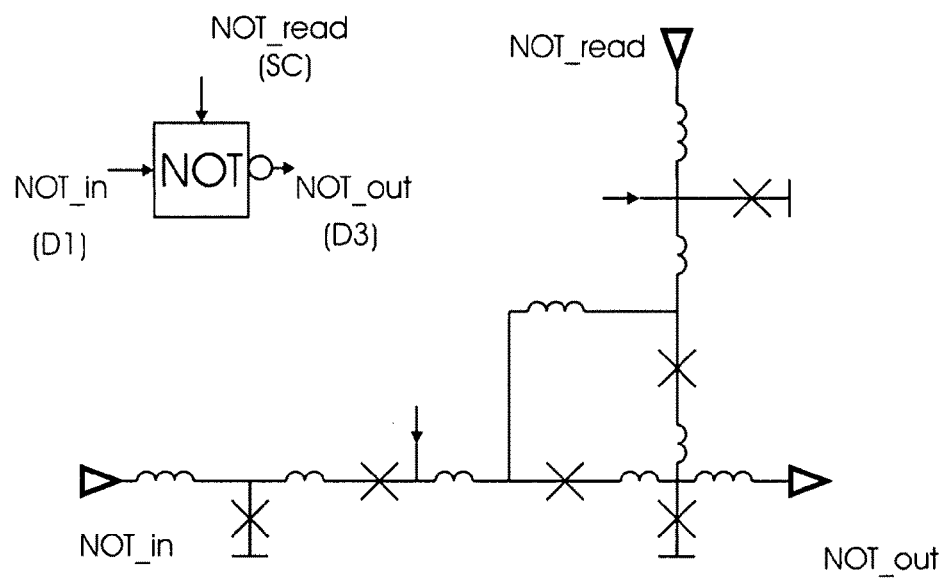
FIG. 3D is a schematic diagram of a NOT-cell which may be used in the circuit of FIG. 3A.
Figure 3E:
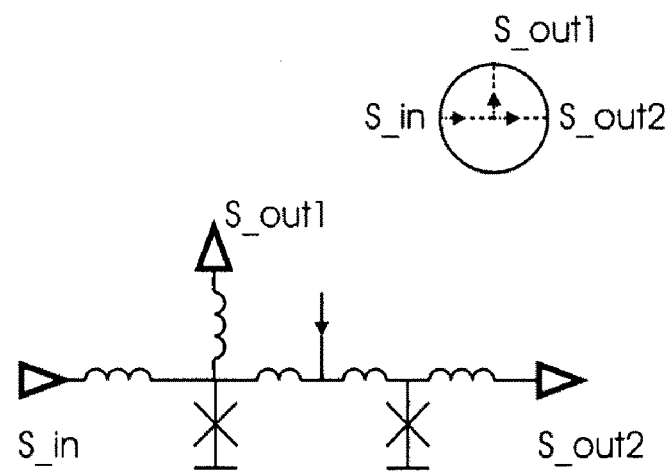
FIG. 3E is a schematic diagram of a splitter cell which may be used in the circuit of FIG. 3A.
Figure 3F:
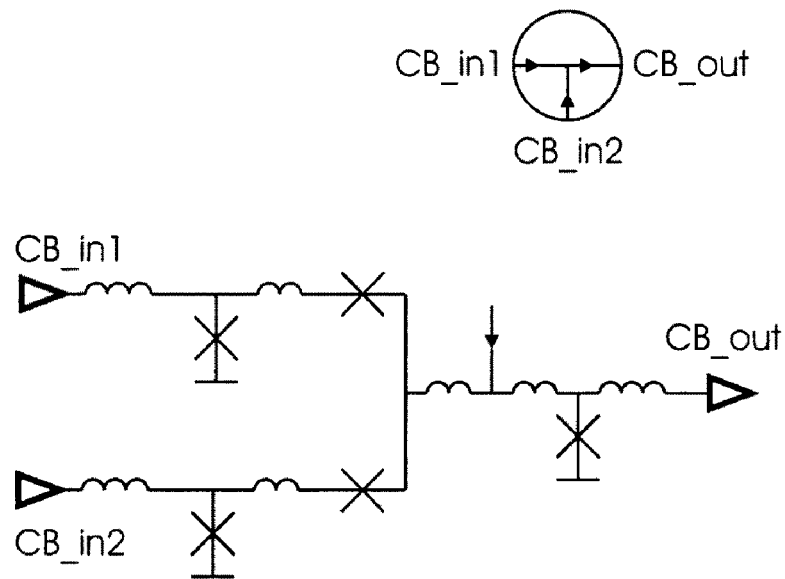
FIG. 3F is a schematic diagram of a Merger/Confluence Buffer cell which may be used in the circuit of FIG. 3A.
Figure 3G:
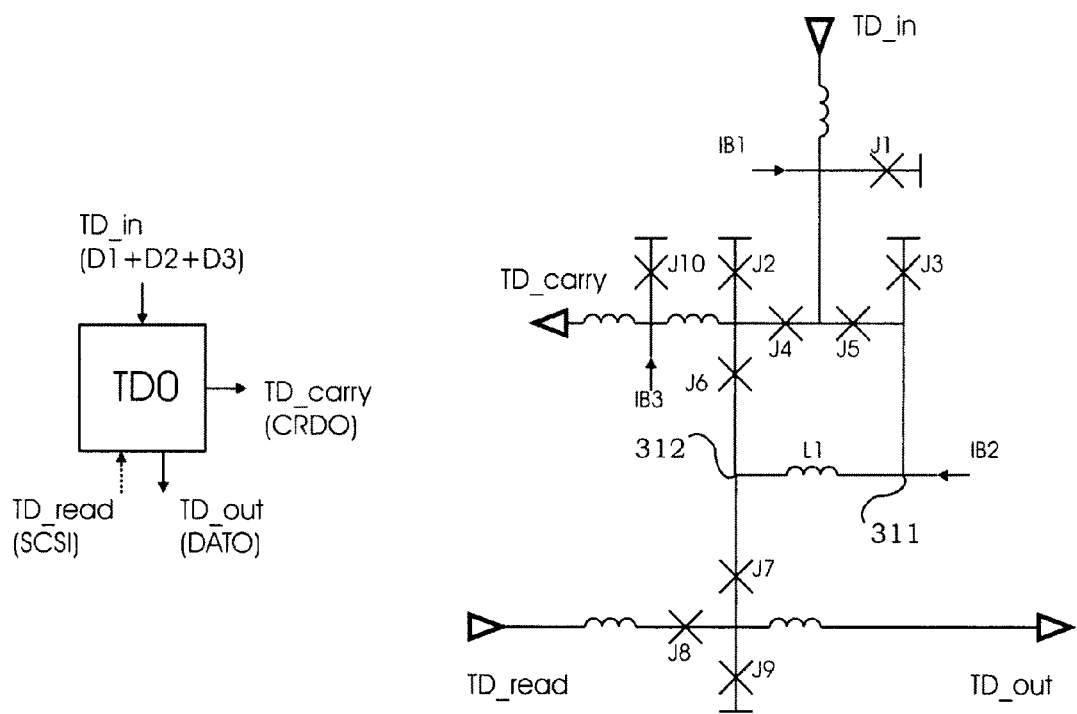
FIG. 3G is a schematic diagram of a toggle or T-flip-flop (denoted as TD0) with destructive readout which may be used in the circuit of FIG. 3A.
Figure 3H:
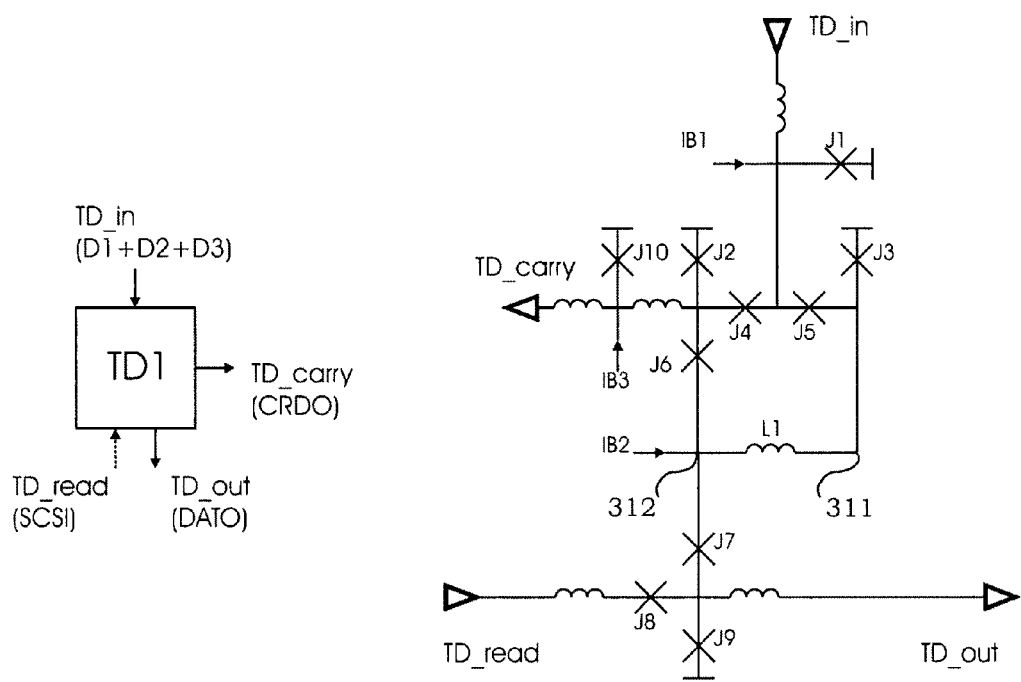
FIG. 3H is a schematic diagram of a modified T flip-flop (denoted as TD1) which may be used as the LSB cell in the circuit of FIG. 3A.

Note: (a) The D flip flops (DFF) (see FIG. 3C) function to store an input signal (bit) applied to their inputs (D_in). The input bit is read out (destructively) onto the D_out terminal in response to a clock or trigger signal applied to the D_read terminal. (b) The NOT cell (see FIG. 3D) functions to store and invert a data bit applied to the input NOT_in of the cell during one clock period. The inverted data bit is released or readout (destructively) onto the output (NOT_out) of the cell in response to a subsequent clock or trigger signal applied to a read terminal (NOT_read) of the cell. (c) The TFF cell (e.g., TD31) may be a TD0 cell as shown in FIG. 3G or a TD1 cell as shown in FIG. 3H.

(i) the TD0 cell (see FIG. 3G) has an input terminal TD_in to which is applied one or more pulses, an asynchronous output terminal (TD_carry), a clocked data output terminal (TD_out) onto which the data stored in the cell is (destructively) read out in response to a clock or trigger signal applied to the read contents terminal (TD_read). The TD0 cell functions as a 1-bit binary adder, where the internal state of the bit is read out by the clock, after which it is reset to '0'. The input corresponds to the number of separate (non-overlapping) input pulses entering the TD_in input terminal between a given clock signal and the next clock signal. The function of the cell is such that for:

(a) One input pulse: the carry out is '0' (no pulse) and in response to a subsequent clock signal the data out (TD_out) is a '1' (a pulse).

(b) Two input pulses: the carry out is a '1' (a pulse) and in response to a subsequent clock signal the TD_out is a '0' (i.e., no pulse).

(c) Three input pulses: the carry out is a '1' (a pulse) and in response to a subsequent clock signal the TD_out is also a '1' (ie. a pulse).

(ii) the TD1 cell (see FIG. 3H) is similar to the TD0 cell, except that the internal state is reset to '1' by the clock.

FIG. 3G is a simplified schematic of a TD cell with the initial state equal to zero (TD0 cell). In FIG. 3G an inductor L1 is connected between nodes 311 and 312 and a bias current IB2 is supplied to node 311. As shown in FIG. 3H the TFF of FIG. 3G can be transformed into a TD1 cell, with initial state equal 1, by applying the bias current IB2 to node 312 on the other side of the storage inductor, L1.

Referring to FIG. 3A, the input data labeled DATI is applied to clocked flip flop D31. The output of D31 labeled D1 is applied to an input of a splitter S31. One output of S31 (also labeled D1) is applied to an input of NOT cell 131 and another output of S31 (also labeled D1) is applied to an input of combiner C31. A carry signal (CRDI) is applied to a clocked flip flop D32. The output of D32, denoted as D2, and the output of I31, denoted as D3, are applied to a combiner circuit C32 to produce an output denoted as D2+D3. The output D2+D3 and the output D1 from S31 are applied to combiner C31 to produce a combined signal denoted as D1+D2+D3. The combined signal D1+D2+D3 is applied to an input of a TFF, denoted TD31, having an output at which is produced the data output DATO (D4) and having another output D5 at which is produced the asynchronous carry output (CRDO). TD31 is read out when clocked by a clock SCSI applied to its read-out input terminal.

Where "m" DFR cells are interconnected serially to process an m bit word, the carry output signal produced in a cell is applied to the carry input of the next succeeding cell, except for the last cell processing the most significant bit (MSB). Note also that carry input of the first cell processing the least significant bit (LSB) is specially designed to satisfy a requirement of eq. 1 as discussed below.

FIG. 3A shows a slow clock input SCNI applied to a splitter S32 having an output applied to splitter S33 and another output supplied to splitter S34. The slow clock applied to S33 is used to produce slow clock outputs SCNO and SCEO. The slow clock SCNI is applied via splitter S32 to splitter S34 to produce SCSO and via splitter S34 to splitters S35 and S36 to apply the slow clock to D31, D32 and I31. Splitters S35 and S36 are designed and laid out such that the response of circuits D32, I31 and D31 occur in a predetermined sequence to ensure that the pulses generated by these circuits and applied to TD31 occur in a prescribed sequence. Cell 10 includes an input port for the input carry bit (from the adjoining less significant bit) CRDI, and an output port for the (asynchronously produced) output carry bit (to the next more significant bit) CRDO.

One aspect of the operation of cell 10 may be explained with reference to FIG. 3A and the pulse/timing diagram of FIG. 3B. Assume, as shown in FIG. 3B, that just prior to the application of clock signal CL1, there is a "1" at CRDI_in and a "1" at DATA_in and that the data stored in NOT cell I31 is also a "1". In the discussion to follow and in the appended claims a logic "1", or "high", is arbitrarily defined as a condition corresponding to the presence, or occurrence, of a recognized pulse between two clock periods, or a relevant time window; and a logic "0", or "low", is arbitrarily defined as a condition corresponding to the absence of a recognized pulse between two clock periods, or a relevant time window.

As noted above, the circuit is designed and laid out such that there is a predetermined and sequential response to clock pulses. By way of explanation, when a first clock pulse, denoted as CL1, is applied via S35 to D32 it causes a pulse (high) at the output of the CRDI_D (D 32). The pulse (high) is coupled via combiners C32 and C31 to produce a high input pulse (A1) at the input of TD31. Then, the clock CL1 is applied via gate S36 to the NOT cell or Gate (I31) producing a pulse (high) at its output. This pulse (high) is coupled via combiner C32 and C31 to produce a high input pulse (B1) at the input of TD31. Note that by delaying/sequencing the clock to the NOT gate, the pulses A1 and B1 applied to TD31 are appropriately spaced apart from each other. The A1 and B1 pulses applied to TD31 cause an asynchronous high output pulse (C1) to be produced at the carry output (CRDO) of TD31.

The clock pulse CL1 applied to D31 causes a pulse (high) to be produced at its output. This high is then coupled via combiner C31 to produce a high input pulse (E1) at the input of TD31. When a read out command (SCSI) is applied to TD31 the logic "1" (or zero) stored in the gate will be read out as a high (or "low") pulse (F1) on TDout.

The operation of cell 10 will now be explained with reference to FIGS. 3A and 3B in response to a second clock signal, CL2, for the condition of a "1" at CRDI_in and at DATA_in and a "0" data bit stored in NOT gate I31. Similarly to the description above, CL2 is applied via S35 to D32 causing a pulse (high) to be produced at the output of the CRDI_D (D 32). The pulse (high) is coupled via combiners C32 and C31 to produce a high input pulse (A2) at the input of TD31. Then, the clock CL2 is applied via gate S36 to the NOT Gate (I31) whose output is or remains at zero (low) indicative of the absence of a pulse in the relevant time window. This low is coupled via combiner C32 and C31 and produces no change at the input of TD31. However, the clock pulse CL2 applied to D31 causes a pulse (high) at its output. This pulse (high) is then coupled via combiner C31 to produce a second high input pulse (E2) at the input of TD31. The A2 and E2 pulses applied to the TD31 cause an asynchronous high output pulse (C2) to be produced at the carry output (CRDO) of TD31. When a read out clock (SCSI) is applied to TD31 the data (0 or 1) stored in the TD31 gate will be read out on TD out.

It is important to note that the circuits of cell 10 are laid out and that the clock is distributed among and along the circuits of the cell such that, as shown in FIG. 3B, the pulses (D1, D2, D3) applied to TD31 from the three inputs enter at different times, avoiding collision. This is achieved with special attention to timing, including insertion of extra Josephson transmission lines (JTLs) which may consist of one or more JJ's and inductors or other delay elements (not shown). The timing of pulses combined together (by means of C31 and C32) in the differentiator of FIG. 3A (using asynchronous confluence buffers) is important to the proper design and operation of cell 10 (and a differentiator stage where a large number of DFR cells are serially interconnected).

As designed, all the pulses arrive at the input of the TD31 cell separated in time. The slow clock (SC) clocks DFF D32 (D_CRDI), then NOT cell (I31), then DFF D31 (D_DATI). This sequencing provides some "natural" positioning of pulses. These pulses are separated even more by 1) minimizing the distance between D_CRDI and TD31 in the physical layout of the components; 2) increasing proportionally NOT-to-TD31 and D_DATI-to-TD31 distances by adding extra JJs or JTLs. By way of example, in an embodiment of cell 10 the pulses propagated to the input of TD31 are separated by 10-15 picoseconds to ensure the desired response of TD31. Thus, the clock signal is distributed within the DFR cell such that the generation and timing of the pulses within the DFR cell 10, (where pulses corresponding to a carry bit, an inverted delayed data bit, and the present data bit are combined on the input line to the TD31) is arranged to eliminate or markedly reduce the possibility of the pulses overlapping and interfering with each other.

It should be noted that a finite time (e.g., up to 50 picoseconds or more) is required to generate the carry output within a cell. The delay is due in part to the fact that the cell circuitry is designed to ensure pulse separation at the input to TD31. Nevertheless, the total circuit delay associated with the asynchronous generation of the TD_carry output CRDO (pulse D5) is designed to be small, much less than the slow clock period and also less than the fast clock period. (The pulses shown in FIG. 3B are not to scale being spread out for clarity.) For use of DFR cell 10 in a digital interpolation filter (DIF), the circuit delay time for producing the carry out signal is preferably also less than the fast clock (FC) used elsewhere in the DIF. As an example, a DFR cell was designed with a carry output delay (after the clock trigger) corresponding to approximately 50-70 picoseconds. For purpose of illustration, for the application to a Direct Digital Synthesizer, described in FIG. 2, the fast clock period is 500 picoseconds (i.e., corresponding to a frequency of 2 GHz), whereas the slow clock period is 8000 picoseconds (corresponding to a frequency of 125 MHz). It is important to note that although there is a delay associated with the generation of the asynchronous carry output, generating the asynchronous carry output within a time period comparable or less than the period of a fast clock, makes the cell operation compatible with operation at the very fast clock rate. This is important for proper timing of the clock and data in a DIF (as described below with regard to FIG. 7).

Figure 4A:
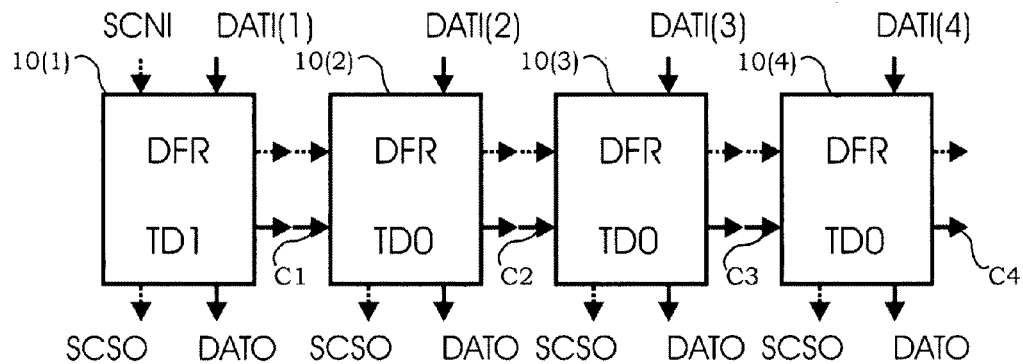
FIGS. 4A and 4B are block diagrams of alternative multi-bit row layouts of a differentiator stage with 4 single-bit DFR cells.
Figure 4B:
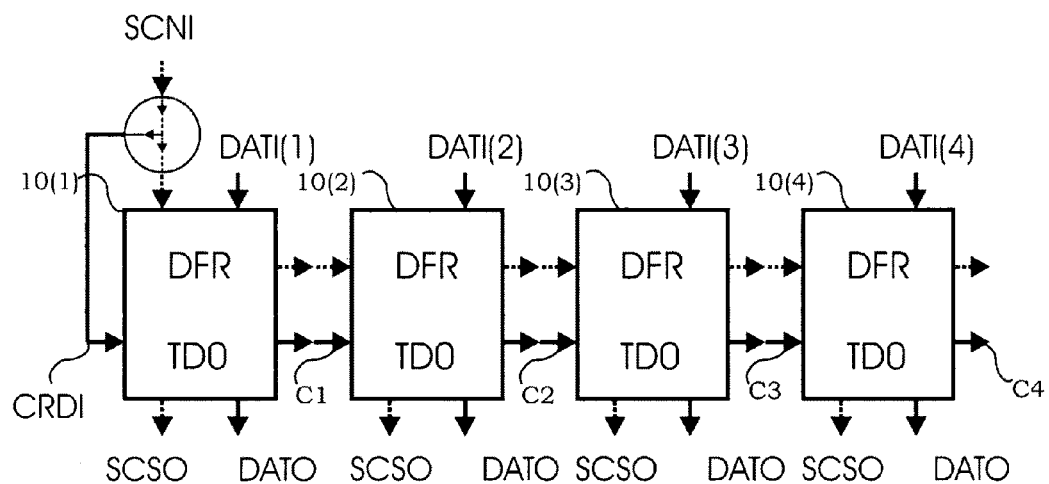

A large number of differentiator cells (DFR) 10 may be serially connected to form a differentiator circuit, or stage, as shown in FIGS. 4A and 4B. In FIGS. 4A and 4B a row of four DFR cells (i.e., cells 10) are shown interconnected to form a multi-bit differentiator circuit, with the least significant bit (LSB) on the left and the most significant bit (MSB) on the right. It should be appreciated that many more than 4 DFR cells may be serially interconnected. There is virtually no limit on their number, other than the size of the word being processed. The two differentiator stages are the same except for the left most LSB cell. In FIG. 4A, the LSB cell is a TD1 cell (where the TD1 cell includes a TFF cell of the type shown schematically in FIG. 3H). In FIG. 4B, the LSB cell is a TD0 cell (where the TD0 cell includes a TFF cell of the type shown schematically in FIG. 3G).

The notation TD0 indicates that the TFF cell (of the type shown in FIG. 3G) inside the DFR is initially storing a "0" and the notation TD1 indicates that the TFF cell (of the type shown in FIG. 3H) inside the DFR is initially storing a "1". In FIG. 4A the TFF of FIG. 3H is initially set to '1' (to provide the value required by the +1 term in Eq. 1) and no carry input signal is used. After the data bit is read out by the clock, the TD1 resets back to '1'. In the alternative arrangement of FIG. 4B a TD0 cell is used and clock input (SCNI) is sent to the carry-in terminal (CRDI) input of the LSB position, and adds a +1 to the TD0 cell as required to provide the +1 term in Eq. 1. This particular arrangement of the TD cell at the LSB position (extreme left in FIGS. 4A and 4B) provides an extra 1 required for correct conversion of an m-bit word into the corresponding negative number in two's complement representation, as indicated by the +1 term on the right in Eq. 1 above.

Figure 1:
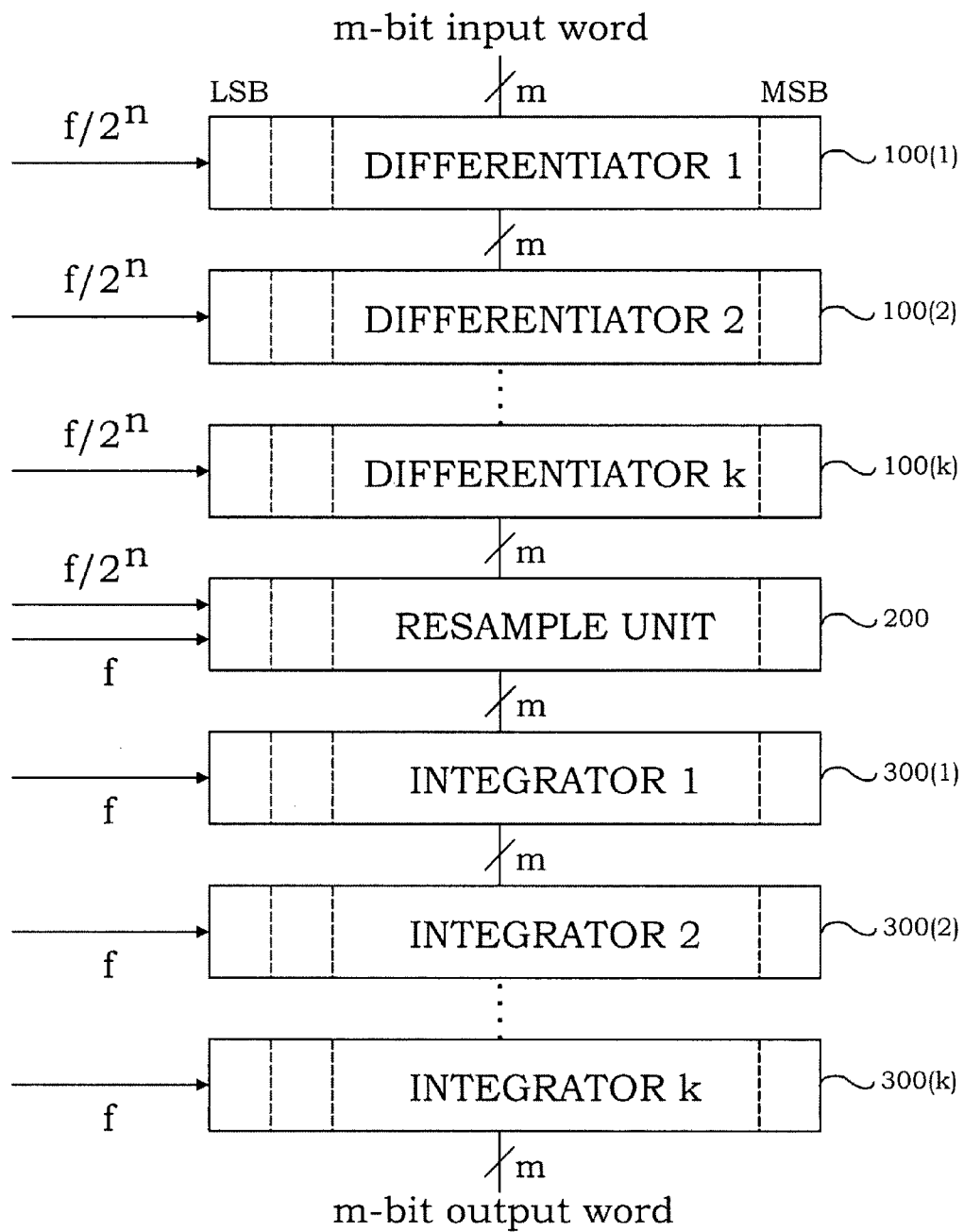
FIG. 1 is a block diagram of a k-th order Digital Interpolation Filter (DIF)

It should also be appreciated that "k" differentiator stages may be formed by stacking rows of cells one on top of the other, in the vertical direction, where k may be any integer equal to or greater than 1, as suggested in FIG. 1 and that "m" cells may be serially interconnected, where "m" is any integer equal to or greater than one. Thus, the cells are stackable (in the vertical direction) to produce a high order filter and expandable (in the horizontal direction) to produce a longer string of cells.

Figure 5A:
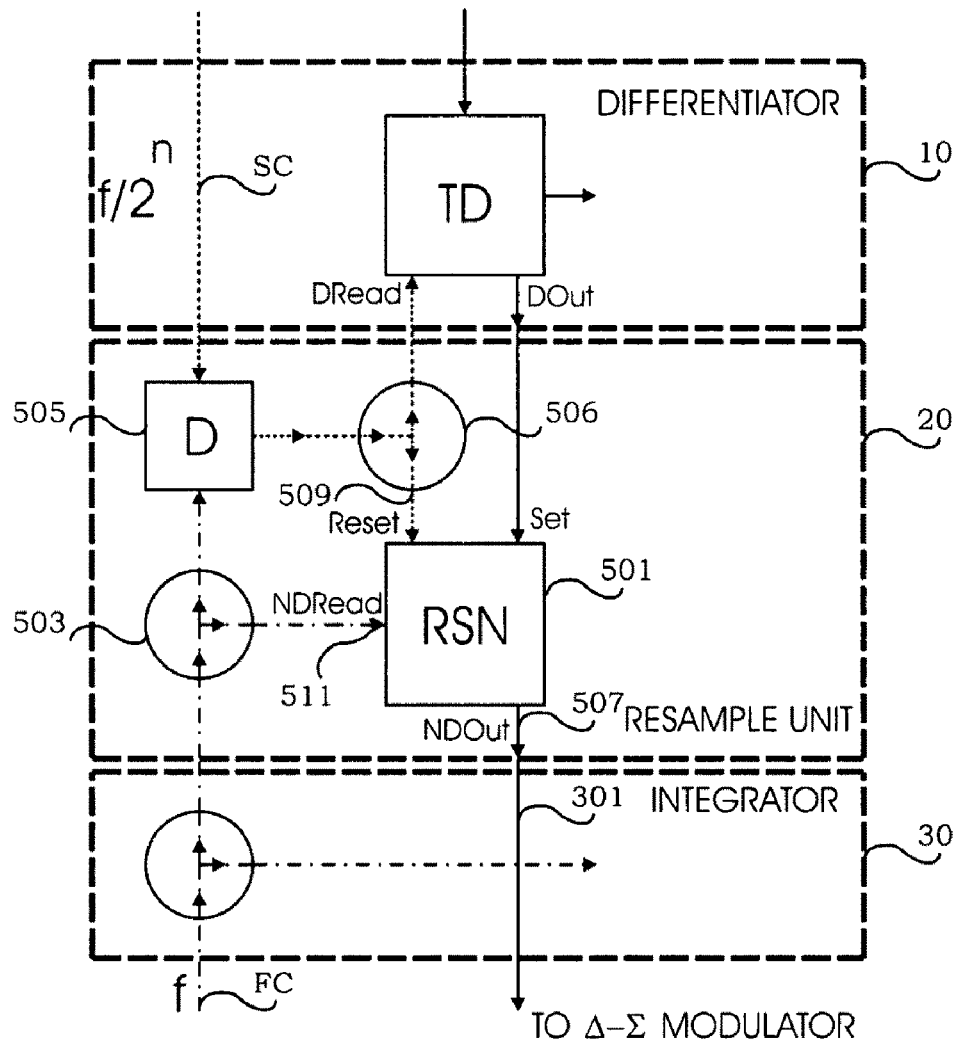
FIG. 5A is a block diagram of a single-bit resample unit (RU) cell connected to a differentiator stage cell and the cell of an integrator stage.
Figure 7:
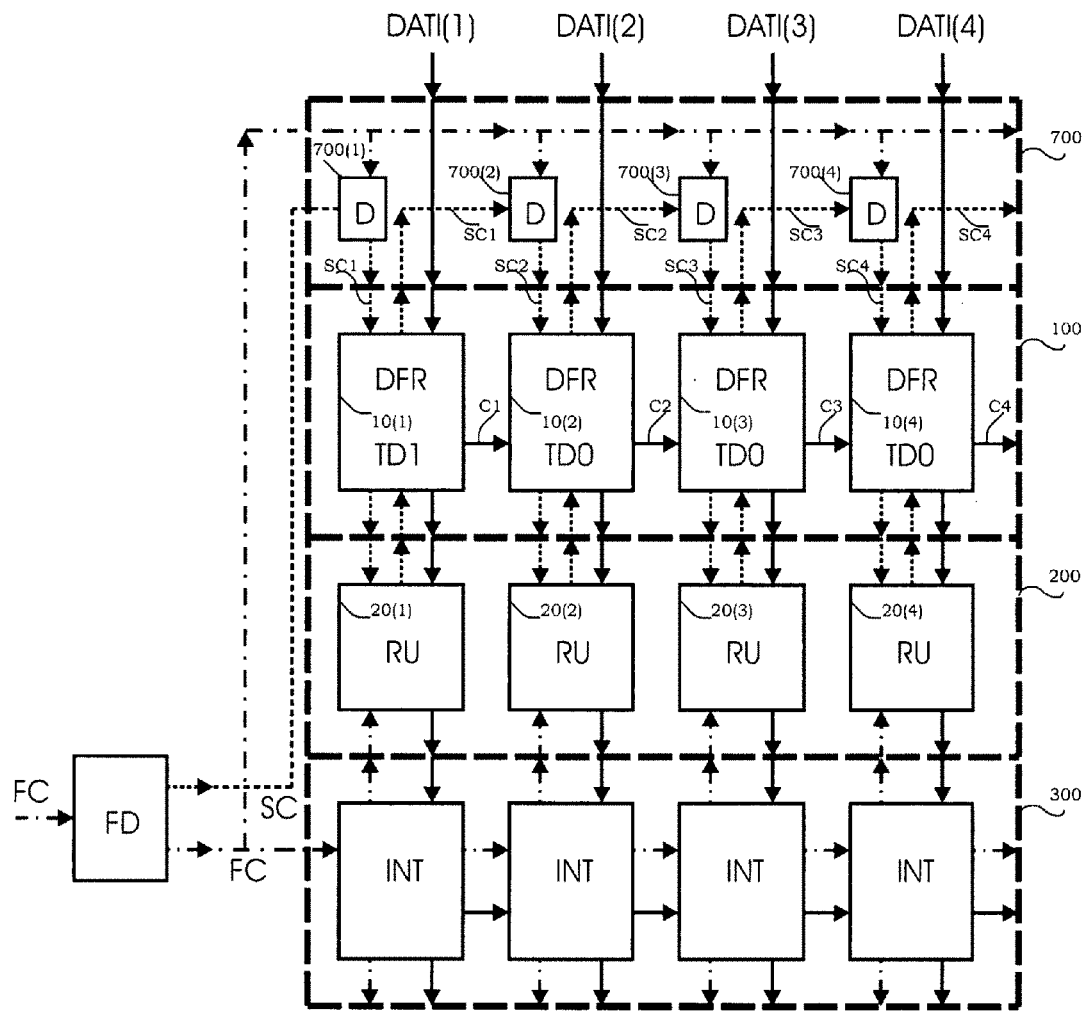
FIG. 7 is a block diagram of a 4-bit, 1st order digital interpolation filter (DIF) embodying the invention.

An examination of FIGS. 5A and 7 indicates that there is a flow of data signals and clock signals along a column (bit slice) comprised of a DFR cell 10, an RU cell 20, and an integrator cell 30. The DFR cell 10 is activated/operated by a slow clock (SC), the RU cell 20 is activated/operated by the slow clock (SC) and a fast clock (FC) and the integrator cell 30 is activated/operated by the FC. FIG. 7 (like FIGS. 4A and 4B) indicates that, along a row of DFR cells there is the propagation of a carry output signal (Ci) from cell to cell and the distribution of the slow clock from cell to cell along the row. FIG. 7 further includes circuitry (network 700) for controlling (delaying) the slow clock by one fast clock period per column as the slow clock is propagated form column to column. The control of the clock as it is propagated from the DFR cell of one column to the DFR cell of the next column solves a race condition problem discussed below. Concurrently, by synchronizing the slow clock with the fast clock the data transferred from a DFR cell to its corresponding RU cell enables data transfer to the corresponding INT cell in a precise and correct manner.

The race problem condition from column to column is first briefly discussed. Applicants recognized the existence of a potential race condition inimical to the proper operation of a differentiator stage. Note that the data bits [e.g., DATAI(1)-(4)], shown in FIGS. 4A, 4B and 7, are introduced in parallel into their respective DFR cells. Signal processing within each cell occurs when a clock signal (e.g. SCNI, or SCi) is applied to the cell. By way of example, signal processing (calculations) occurs first for the DFR cell [10(1)] processing the LSB (on the left in FIGS. 4A, 4B and 7). As discussed above, in response to a clock signal applied to DFR cell, a carry output signal (Ci) may be produced at the output of a DFR cell [within a finite time period "T" (e.g., 50 picoseconds, more or less). This carry out signal (e.g., C1) is then applied to the carry input of the next cell [e.g., 10(2)]. If the next cell [e.g., 10(2)] is activated by a clock pulse before the arrival of the carry output from the preceding cell, an error will be introduced in the calculation/processing of the data bit. Therefore, for the next DFR cell [e.g., 10(2)] to correctly process its input data bit and its carry input, the cell must receive the carry input before being activated by a clock pulse; i.e., the input data bit and the carry input tot eh cell must both be present. Therefore, a delay is introduced between the activation of one cell and the activation of the next succeeding cell handling the next higher data bit. Alternatively, by way of example, entry of a given data bit (e.g., DATAI (3) into the networks of a DFR cell [e.g., 10(3)] could be delayed until the relevant carry bit [e.g., C2 from cell 10(2)] is made available to cell 10(3). A network such as the clock digital network 700 in FIG. 7 ensures that the required timing is incorporated into the cell and differentiator circuitry.

A discussion of a novel resample cell for practicing the invention follows. FIG. 5A includes a block diagram of a resample (or upsample) bit cell 20 which can be used to form resample unit (RU) 200. The value of a bit (of a multi-bit digital word) is introduced into cell 20 at a slow clock rate (SC). Cell 20 repeats each value N times at a faster clock rate (FC), where, for this example, $N=2^n=FC/SC$ is the upsample factor. Cell 20 includes an RSN cell (Reset-Set flip-flop with non-destructive readout) 501, a D-flip-flop (DFF) 505 and two splitter cells 503 and 506. RSN cell 501 has (see FIGS. 5A and 5B): (a) a set input connected to the data output DOut of a corresponding bit DFR cell 10 (in the last differentiator (DFR) stage, as per FIG. 1); (b) a reset input 509 connected to an output of a splitter 506 which supplies a synchronized slow clock signal generated by DFf 505; (c) a read-out trigger terminal (NDRead) 511; and (d) a data output terminal 507 (NDOut) connected to an input 301 of a corresponding bit cell 30 (of the first integrator (INT) stage, as per FIG. 1).

The NDRead command signal is derived from the fast clock (FC) applied to splitter 503 which has an output connected to the NDRead terminal 511 of the RSN cell 501. Because the RSN cell is a non-destructive memory cell, its set content ("1" or "0") may be read out repeatedly, until its bit content is reset to zero (Reset). The readout of the RSN cell is triggered by the fast clock FC, while the application of the Reset and Set signals are triggered by the slow clock (SC). For proper operation, the NDRead trigger occurs first generating an NDOut signal. Then a Reset trigger is applied which clears the RSN cell. Then, a new set bit input (DOut from TD cell 10 of the DFR unit above) is applied to RSN. 501. This sequence is shown in the timing diagram of FIG. 5C. After an SC pulse enters D flip flop 505 from cell 10, the DFF 505 stores the SC pulse until the next FC pulse (which concurrently causes an NDRead to be applied to the RSN). An SC pulse is then released and fed to splitter 509 which generates two SC signals, one of which goes down to clear (Reset) the RSN cell, and the other goes up (DRead) to readout and clear (destructively read) the TD in cell 10. The TD cell then releases its contents on the DOut line, which then enters the Set input of the RSN. The set input ("1" or "0") can then be read out multiple times using the FC signal (NDRead), until the next SC signal from above resets the RSN and initiates the application of a new set signal.

Figure 5B:
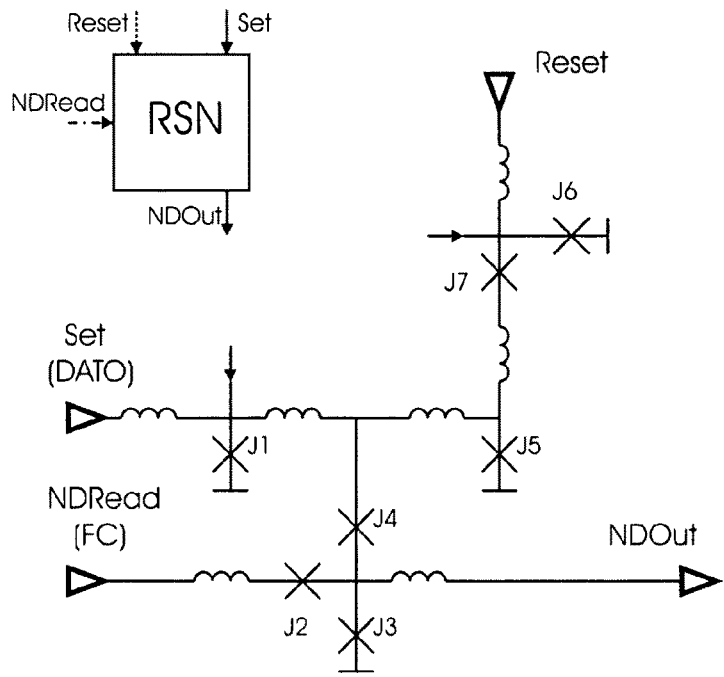
FIG. 5B is a schematic diagram of an RSFQ circuit implementation of an RSN cell shown in FIG. 5A.

RSN cell 501 may be implemented in RSFQ logic and may be an R-S flip-flop with non-destructive readout as shown schematically in FIG. 5B. The R-S flip flop includes JJs indicated by an X and series inductors. The R-S flip flop functions such that an input pulse (high) on the SET input causes a flux quantum (a bit) to be stored as circulating supercurrents in the cell. If a read-out command (i.e., a pulse) enters the NDRead input while this bit (high) is stored, a pulse ('1') will be generated at the NDOut output. Such an output can be generated each time a read-out command is applied (e.g., multiple times). Hence RSN cell 501 provides a "Non-Destructive Read". The bit (high or low) applied to the set input remains in place within the cell until another pulse enters on the RESET input. Thus, in the resample unit, the RSN cell 501 is set (to a "high" or "low") by the application of an input signal (DOut) from the DFR cell 10 to the set input terminal. After being set, RSN cell 501 repeats the input signal (DOut) at its output (NDOut), at the FC rate, until it is reset by a SC clock derived signal generated by D-flip flop 505 via splitter 506. The reset input to cell 501 is a function of the fast clock triggering the D flip flop 505 to which the slow clock is applied. The output of the D-flip flop 505 is applied via splitter 506 to the read input of the TD cell and to the reset input of the RSN cell. The RSN cell is non-destructively read-out by means of the fast clock (FC) applied to the ND read port of the RSN cell. The RSN cell has a non-destructive read output port which is applied to a corresponding integrator cell.

Figure 5C:
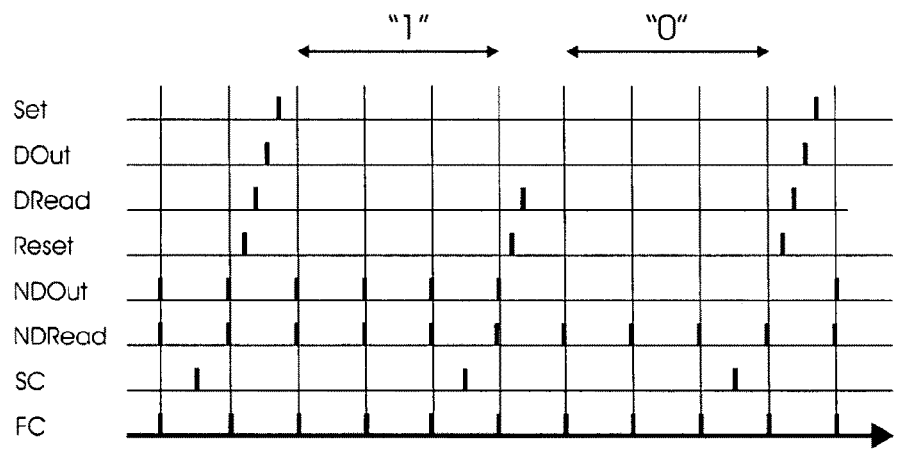
FIG. 5C is a timing diagram illustrating the operation of the circuit of FIGS. 5A and 5B.

FIG. 5C is a sample timing diagram for cell 20 showing various inputs and outputs when the set input signal changes from '1' to '0'. Starting from the bottom left, the fast clock FC is split into the trigger input to the DFF 505 and the NDRead to the RSN. Thus, the fast clock FC sends a pulse via splitter 503 to the NDRead command input terminal of RSN 501. If RSN 501 is storing a "1" (or a "0"), a "1" (or a "0") is generated at the output NDOut which is then fed to the corresponding INT bit cell 30 (of the first integrator stage) at the FC rate. Once set to a given condition, the RSN, which is, in effect, a non-destructive memory cell, produces the same value output each time an FC pulse is applied until RSN 501 is reset. The slow clock SC (4 times slower in this plot) generates the Reset signal to the RSN, as well as a DRead input to the TD in the DFR cell 10, which in turn sends the new Set data to the RSN. The right half of FIG. 5C, corresponding to a '0' coming from the differentiator cell and being stored in the RSN. For this case, the output of RSN cell 501 remains '0' (no pulse) for each NDRead pulse, until the next SC pulse. RSN 501 functions as an upsampler since the SET input contains the data bit from the differentiator (generated at the SC rate) and the fast clock triggers the NDRead. This is illustrated in FIG. 5C. When the data bit to the RSN is '1', the NDOut repeats this '1' at the FC rate for 4 pulses. When the data bit to the RSN is '0', the NDOut is then '0' (i.e., no pulse output) for the next 4 FC periods.

In contrast to the RSN, the DFF 505 is a destructive memory cell, and releases its contents (the SC input) only once, just after it is triggered by the FC input. DFF 505 serves to re-synchronize the local SC distribution to a fraction of the FC rate (4× faster in FIG. 5C) and to reset the RSN cell just before it receives a new data bit.

This is important since clock skew will occur in a large digital system at high (GHz) data rates. Thus, the use of the two clocks (SC and FC) and the DFF 505 maintains proper local timing for a large number of RU cells, corresponding to a large m-bit word, operating with differentiators and integrators which may include many stages (rows), in a large high-speed digital circuit.

Figure 6A:
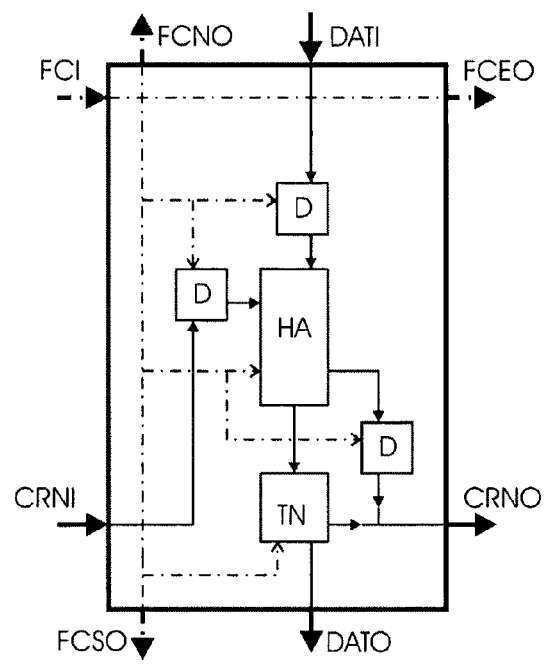
FIG. 6A is a block diagram of a single-bit integrator circuit (INT) cell which may be implemented using standard elementary RSFQ cells.
Figure 6B:
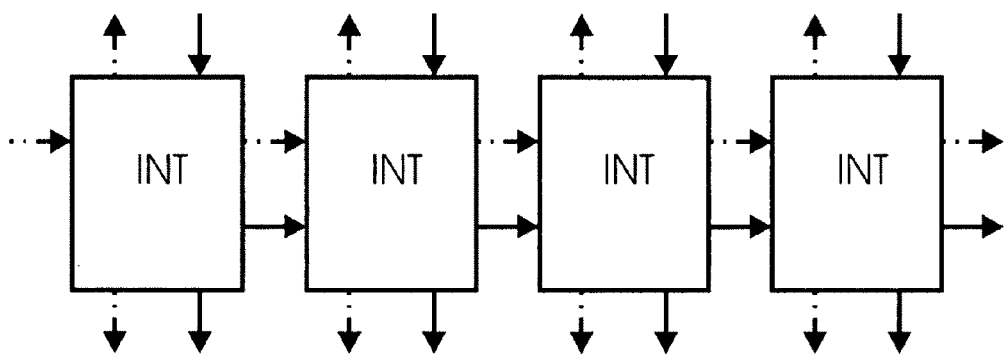
FIG. 6B is a block diagram of a multi-bit row layout of an integrator stage with 4 single-bit INT cells, from LSB left to MSB right.

FIG. 6A is a block diagram of a single-bit integrator circuit (INT) cell which may be implemented using standard elementary RSFQ cells. FIG. 6B shows the multi-bit row layout of an Integrator with 4 single-bit INT cells, from LSB left to MSB right. The INT cell may be of the type used to form an RSFQ digital decimation filter and includes a fast clock distribution lines FCI, FCEO, and FCSO (input, horizontal output, and vertical output), a data input DATI, a data output DATO, a carry input (from the less significant bit) CRNI, and a carry output (to the more significant bit) CRNO. The INT cell includes elementary RSFQ clocked cells HA (half-adder), TN (T-flip-flop with non-destructive output), D (D-flip-flop), as well as asynchronous splitters and combiners (confluence buffers). The clock, sum, and carry signals connecting between these INT cells for multiple bits within a row (and multiple rows for higher order filters) is shown in FIG. 6B.

FIG. 7 is a block diagram of a 4-bit, 1st order digital interpolation filter (DIF), showing the generation and routing of slow clock (SC) and fast clock (FC), and the use of a row of D-flip-flops 700 to properly synchronize the data and clock signals. A Frequency Divider Cell (FD) formed from a combination of a chain of T-flip-flops generates the slow clock (SC) by binary division by $2^n$ from the fast clock FC. A binary divider is used, but any suitable different divider ratio may be used. The SC signal is distributed to and along the various columns (bit slices) and is properly synchronized with the input data by using the FC signal and a row 700 of D-flip-flops. FIG. 7 includes a 4-bit differentiator stage 100 (which may be made up of cells 10 to process the input word from the LSB on the left of the figure to the MSB on the right) coupled to a 4-bit resample unit (RU) 200 (which may be made up of cells 20) coupled to an integrator stage 300. Extension to a higher-order DIF can be obtained by inserting one (or more) additional rows of DFR cells above the RU cells and a like number of additional rows of INT cells below the RU cells. Additional bits can be processed simply by adding more columns (slices) to the right. Thus, a DIF circuit embodying the invention may include "m" columns (bit slices) with an RU unit 200 comprised of "m" cells, k rows (stages) of "m" DFR cells 10, k rows (stages) of "m" INT cells 30 and a delay network 700 for synchronizing the SC and FC operation of the DIF; where "m" is any number equal to or greater than one.

In FIG. 7, the data bits [e.g., DATAI(1) through DATAI(4)] enter the top differentiator stage in parallel. The top row 700 of DFFs functions to delay the SC signal for each bit slice (column) by a fast clock period FC per bit slice (column). By way of example, note that the slow clock (SC) applied to DFF 700(1) is released (readout destructively) when a first FC pulse is applied to DFF 700(1). For ease of explanation, refer to this SC clock as SC1 which is distributed to the circuits along the first column (bit slice) and to the input of DFF 700(2). When the next (second) FC pulse occurs, the SC1 data stored in DFF 700(2) is released and an SC pulse which may be denoted as SC2 is produced at the output of DFF 700(2). The SC2 clock pulse is then distributed along the components of the second column. This operation is repeated as the clock signaly is serially and sequentially propagated along the differentiator cells. The SC clock signal is repeatedly delayed s it is being propagated and distributed along the "m" cells and columns to ensure proper operation of the differentiator. This delaying scheme allows a DFR cell 10 corresponding to an "ith"-bit to process its data and carry inputs and produce a carry out which can be applied to the next cell corresponding to the (i+1)-bit in appropriate phasal relationship with the data bit input to the (i+1)-bit cell.

Recall that since the incoming data bit into the DFR cell (FIG. 3A) is stored in a DFF (e.g., D31) before being released by an SC pulse. Since the SC pulse is held in network 700 until an FC pulse applied, this amounts to an effective delay of one FC period from one bit slice to the next. This data delay is sufficient to take care of the race condition discussed above because the generation of the carry bit from one DFR cell to the next is asynchronous and very fast, typically less than the time period of the FC. A further advantage of this timing arrangement is that the INT cells (which operate at the FC rate) also have a delayed carry output with a delay of one (1) FC period. This means that the data delay in the differentiator stages will match that needed for the input to the integrator stages, without the need for any further timing delay adjustment network.

This is in contrast to a more conventional design based on a standard pipelined multi-bit adder which would require a delay of one (1) SC period in the differentiator stages, which would then be mismatched with the delay of one (1) FC period required for the integrator stages. The design of FIG. 7 provides improved operation in permitting faster operation with minimum pipeline delay.

The present invention was reduced to practice by fabricating several test circuits comprised of 4-bit differentiators and resample units, using superconducting integrated circuit technology based on niobium Josephson junctions. These were tested at a temperature of 4K and found to function properly according to design criteria with output frequencies up to about 20 GHz, suitable for a fast direct digital synthesizer and other digital radio-frequency applications.

What is claimed is:

1. A differentiator cell comprising:
a first input terminal for receiving a carry input;
a first flip flop having an input coupled to said first input terminal and an output coupled to an input of a toggle flip flop (TFF);
a data input terminal for receiving a data bit;
a second flip flop having an input coupled to said data input terminal and an output coupled to the input of the TFF;
a clocked not-cell responsive to the data bit for generating an output signal which corresponds to the two's complement of the data bit and for applying said output signal to the input of the TFF;
a clock input for receiving a clock signal;
means coupling the clock input to the first and second flip flops and to the not-cell for triggering the first and second flip flops and the not-cell in a predetermined sequence for causing their outputs to be applied as distinct and separate pulses to the input of the TFF; and
the TFF being responsive to the signals at its input for producing a carry output and a data output in response to a clocked data read signal.

2. A differentiator cell as claimed in claim 1 wherein the carry output is asynchronous and is produced in direct response to the application of signals to the input of the TFF.

3. A differentiator cell as claimed in claim 2 wherein the clock signal has a given period; and wherein the carry output is produced in a small fraction of the given period.

4. A differentiator cell as claimed in claim 1 wherein the flip flops, the not-cell and the TFF are formed using superconducting Josephson junctions interconnected to provide rapid-single-flux-quantum (RSFQ) logic.

5. A differentiator cell as claimed in claim 4 wherein the first and second flip flops are data flip flops (DFFs), wherein the not-cell includes storage and inverting elements, and wherein the clock input is distributed via splitter circuits to the first flip flop, the storage and inverting elements and the second flip-flop.

6. A differentiator cell as claimed in claim 5 wherein the outputs of the first and second flip flops and the storage and inverting elements are coupled via a combiner circuit to a signal input of the TFF.

7. A differentiator cell as claimed in claim 5 wherein the clock input is coupled via splitter circuitry to a clock output for application to a subsequent cell.

8. A cell comprising:
a first input terminal for receiving a carry input;
a first flip flop having an input coupled to said first input terminal and an output coupled to an input of a toggle flip flop (TFF);
a data input terminal for receiving a data bit;
a second flip flop having an input coupled to said data input terminal and an output coupled to the input of the TFF;
a clocked storage and inverting element responsive to a data bit present during a clock period for producing an output signal which is the inverse of the data bit during a subsequent clock period and including means coupling the output signal to the input of the TFF,
a clock input for receiving a clock signal;
means coupling and distributing the clock input to the first and second flip flops and to the clocked storage and inverting element for triggering the first and second flip flops and the storage and inverting element for causing their outputs to be applied to a signal input of the TFF as distinct and separate pulses; and
the TFF being responsive to the pulses at its input for producing an asynchronous carry output and for producing a data output in response to a clocked data read the contents command.

9. A cell as claimed in claim 8 wherein the first and second flip flops are data flip flops (DFFs) and wherein the clock input is coupled and distributed to first trigger the first flip flop, to then to trigger the storage and inverting element and to then trigger the second flip flop for sequencing and spacing the generation of the pulses applied to the input of the TFF.

10. A cell as claimed in claim 8 wherein the clock input is distributed via splitter circuits to the first flip flop, the storage and inverting element and the second flip-flop.

11. A cell as claimed in claim 9 wherein the flip flops and the storage and inverting element and the TFF are formed with superconducting Josephson junctions interconnected to provide rapid-single-flux-quantum (RSFQ) logic.

12. A cell as claimed in claim 9 wherein the outputs of the first and second flip flops and the storage and inverting element are coupled via a combiner circuit to the input of the TFF.

13. A cell as claimed in claim 12 wherein the clock input is coupled via splitter circuitry to a clock output for application to a subsequent cell.

14. A differentiator circuit for processing an m-bit word comprising:
m differentiator cells, one cell per bit of the m-bit word;
each cell having a data input terminal, a carry input terminal, a clock input terminal, a carry output terminal, a data output terminal and a clock output terminal, wherein each one of the m bits is applied, in the order of its significance, to a corresponding cell; wherein each cell includes circuitry for combining pulses corresponding to a carry input signal, a data bit signal and a signal corresponding to the inverse of the data bit from a previous clock period, and applying the combination as separate and distinct pulses to the input of a Toggle flip-flop (TFF) having an asynchronous carry output coupled to the carry output terminal and a clocked data output coupled to the data output terminal;

means coupling the carry output of each cell, except for the mth cell, to the carry input of the cell of next higher bit significance; and means coupling the clock output of each cell to the clock input of the next succeeding cell of higher bit significance.

15. A differentiator circuit as claimed in claim 14 wherein the cell circuitry is comprised of superconducting Josephson junctions interconnected in accordance with rapid-single-flux-quantum (RSFQ) logic technology.

16. A differentiator circuit as claimed in claim 14 wherein, the cells are rendered operative in response to a clock signal applied to the cell circuits; wherein following the application of a clock signal to a cell, a finite time (T) is required to produce a carry output within the cell; and wherein the carry output is coupled to a succeeding cell to be summed with a data bit input applied to the succeeding cell, and further including circuitry for delaying the application of clock signals to each succeeding cell for a time greater than t1 to ensure that the carry output of each preceding cell is produced before the succeeding cell is clocked.

17. A differentiator circuit as claimed in claim 14, wherein a finite time, T, is needed to produce the carry output in any given cell; and wherein the means coupling the clock output of each cell to the clock input of the next succeeding cell includes means for delaying the application of a clock from one cell to the next succeeding cell for a time which exceeds T.

18. A differentiator circuit as claimed in claim 17, wherein the means for delaying the application of a clock includes a delaying data flip flop (DFF) coupled between each succeeding cells, the delaying DFFs having: (a) a data input to which the clock output of the preceding cell is applied, (b) a trigger input to which is applied a triggering signal, and (c) an output coupled to the clock input of the succeeding cell.

19. A differentiator circuit as claimed in claim 18, wherein the triggering signal to the delaying DFFs has a significantly higher frequency than the clock signal and a period which is longer than a time T.

20. A differentiator circuit as claimed in claim 14 wherein the circuitry for combining pulses corresponding to a carry input signal, a data bit signal and a signal corresponding to the inverse of the data bit from a previous clock period, and applying the combination as separate and distinct pulses to the input of a Toggle flip-flop (TFF) includes: a first input terminal for receiving a carry input; a first flip flop having an input coupled to said first input terminal and an output coupled to an input of a toggle flip flop (TFF); a data input terminal for receiving a data bit; a second flip flop having an input coupled to said data input terminal and an output coupled to the input of the TFF; a clocked storage and inverting element responsive to a data bit present during a clock period for producing an output signal which is the inverse of the data bit during a subsequent clock period and including means coupling the output signal to the input of the TFF, a clock input for receiving a clock signal; and means coupling and distributing the clock input to the first and second flip flops and to the clocked storage and inverting element for triggering the first and second flip flops and the storage and inverting element for causing their outputs to be applied to the signal input of the TFF as distinct and separate pulses.

21. A cell comprising:
a non destructive readout flip flop (RSN) having a set input, a reset input, a readout command input and a data output;
a first input terminal for the application thereto of a first clock (FC) comprised of pulses;
a second input terminal for the application thereto of a second clock (SC), comprised of pulses; wherein the frequency of the first clock is N times that of the second clock;
a destructive read-out data flip flop (DFF) responsive to the first and second clocks for producing an output signal pulse corresponding to the second clock in synchronism with a signal from the first clock;
means responsive to the output signal pulse of the DFF for first supplying a reset signal to the RSN flip flop followed by the application of a set signal; and
means responsive to the first clock for applying read-out commands to the readout command input of the RSN for repeatedly producing a data output corresponding to the set signal, until the RSN is reset.

22. A cell as claimed in claim 21 wherein the flip flops are formed using superconducting Josephson junctions interconnected to provide rapid-single-flux-quantum (RSFQ) logic.

23. A cell as claimed in claim 22 wherein the set input to the RSN flip flop is obtained from a differentiator cell whose contents are read out by the output signal pulse from the DFF.

24. A cell as claimed in claim 23 wherein the RSN functions as an upsampler since the set input signal contains data bit information from the differentiator cell, generated at the SC rate, and the fast clock triggers the read out command of the RSN, and wherein the DFF functions to synchronize the slow clock with the fast clock, and resets the RSN cell just before it receives a new data bit.

25. Circuitry for processing a data bit of a word having m-data bits comprising:
a differentiator (DFR) cell having; (a) a data input terminal for the application thereto of a data bit, (b) a carry input terminal, (c) a clock input terminal, (d) a carry output terminal, (e) a data output terminal, (f) a data read command terminal and (g) a clock output terminal, wherein the DFR cell includes circuitry for combining pulses corresponding to a carry input signal, a data bit signal and a signal corresponding to the inverse of the data bit from a previous clock period, and applying the combination as separate and distinct pulses to the input of a Toggle flip-flop (TFF) having an asynchronous carry output coupled to the carry output terminal and a data output coupled to the data output terminal for producing thereat a data output in response to a read command applied to the read command terminal;
a resampling unit (RU) cell having (a) a fast clock input terminal for the application thereto of a fast clock (FC) comprised of pulses; (b) a slow clock input terminal for the application thereto of a slow clock (SC), comprised of pulses; wherein the frequency of the fast clock is N times that of the slow clock; where N is a number greater than one; (c) a destructive read-out data flip flop (DFF) responsive to the fast and slow clocks for producing an output signal pulse corresponding to the slow clock in synchronism with the fast clock; (d) a non destructive readout flip flop (RSN) having a set input, a reset input, a readout command input and a data output; (e) means responsive to the output signal pulse of the DFF for supplying a reset signal to the RSN flip flop before the application of a set signal; and (f) means responsive to the fast clock for applying read-out commands to the readout command input of the RSN for repeatedly producing a data output corresponding to the set signal, until the RSN is reset; and wherein the clock output from the DFR cell is coupled to the slow clock input of the RU cell;

wherein the output signal pulse of the DFF of the RU cell is coupled to the data read command terminal of the DFR cell; and wherein the data output terminal of the DFR cell is coupled to the set input of the RSN.

26. Circuitry for processing an m-bit word comprising:

a differentiator circuit comprised of m differentiator (DFR) cells, one cell per bit of the m-bit word; each one of the m bits being applied to a corresponding cell; each DFR cell having (a) a data input terminal, (b) a carry input terminal, (c) a clock input terminal, (d) a carry output terminal, (e) a data output terminal, (f) a data read command terminal and (g) a clock output terminal; wherein each cell includes circuitry for combining pulses corresponding to its carry input signal, its data bit signal and a signal corresponding to the inverse of the data bit from a previous clock period, and applying the combination as separate and distinct pulses to the input of a Toggle flip-flop (TFF) having an asynchronous carry output coupled to the carry output terminal and a data output coupled to the data output terminal for producing thereat a data output in response to a read command applied to the read command terminal;

m resampling unit (RU) cells, one RU cell per bit of the m-bit word and corresponding DFR cell, each RU cell having (a) a fast clock input terminal for the application thereto of a fast clock (FC) comprised of pulses; (b) a slow clock input terminal for the application thereto of a slow clock (SC), comprised of pulses; wherein the frequency of the fast clock is N times that of the slow clock; (c) a destructive read-out data flip flop (DFF) responsive to the fast and slow clocks for producing an output signal pulse corresponding to the slow clock in synchronism with the fast clock; (d) a non destructive readout flip flop (RSN) having a set input, a reset input, a readout command input and a data output; (e) means responsive to the output signal pulse of the DFF for supplying a reset signal to the RSN flip flop; and (f) means responsive to the fast clock for applying read-out commands to the readout command input of the RSN for repeatedly producing a data output corresponding to the set signal, until the RSN is reset;

wherein a clock output from each DFR cell is coupled to the slow clock input of the corresponding RU cell, whereby the slow clock of the RU cells has the same frequency as the clock signal of its corresponding DFR cell;

wherein the output signal pulse of the DFF of each RU cell is coupled to the data read command terminal of the corresponding DFR cell; and wherein the data output terminal of each DFR cell is coupled to the set input of the RSN of the corresponding RU cell.

27. The circuitry as claimed in claim 26 wherein the carry output of each DFR cell, except for the mth cell, is coupled to the carry input of the DFR cell of next higher bit significance; and wherein the clock output of each DFR cell is coupled to the clock input of the next succeeding DFR cell of higher bit significance.

28. The circuitry as claimed in claim 27 wherein a finite time, T, is needed to produce the carry output in any given DFR cell; and wherein the means coupling the clock output of each DFR cell to the clock input of the next succeeding DFR cell includes means for delaying the application of a clock from one DFR cell to the next succeeding DFR cell for a time which exceeds T.

29. The circuitry as claimed in claim 28 wherein the means for delaying the application of a clock includes a delaying data flip flop (DFF) coupled between each succeeding DFR cells, the delaying DFFs having: (a) a data input to which the clock output of the preceding cell is applied, (b) a trigger input to which is applied a triggering signal, and (c) an output coupled to the clock input of the succeeding cell.

30. The circuitry as claimed in claim 29, wherein the triggering signal to the delaying DFFs corresponds to the fast clock applied to the RU cells, where the period of the fast clock is longer than a time T.

31. In a circuit for processing an m data bit word using m differentiator (DFR) cells, one DFR cell per data bit, each DFR cell having a data input terminal and a carry input terminal and also having a carry output terminal for producing thereat a carry output which is a function of the signals processed by the DFR, wherein there may be a finite time delay, T, in a cell before a carry output is generated; and wherein each cell is activated by a clock signal, the improvement comprising:

means for distributing the clock signal within each DFR cell and serially along the m DFR cells, in order, from the DFR cell responsive to the least significant bit (LSB) to the DFR cell responsive to the most significant bit (MSB); and the clock distribution means including delay means coupled between succeeding DFR cells for delaying the application of the clock signal from a preceding cell to a succeeding cell for a time period greater than T for enabling the carry output of the preceding cell to be applied to the succeeding cell, when the succeeding cell is activated by the clock signal.

* * * * *